United States Patent
Weibel et al.

(10) Patent No.: US 7,036,066 B2
(45) Date of Patent: Apr. 25, 2006

(54) ERROR DETECTION USING DATA BLOCK MAPPING

(75) Inventors: David C. Weibel, Longmont, CO (US); William L. Duncan, Berthoud, CO (US)

(73) Assignee: Sun Microsystems, Inc., Palo Alto, CA (US)

( * ) Notice: Subject to any disclaimer, the term of this patent is extended or adjusted under 35 U.S.C. 154(b) by 488 days.

(21) Appl. No.: 10/155,329

(22) Filed: May 24, 2002

(65) Prior Publication Data

US 2003/0221155 A1    Nov. 27, 2003

(51) Int. Cl.
*H03M 13/00* (2006.01)

(52) U.S. Cl. ............... 714/752; 714/723; 714/758; 714/807

(58) Field of Classification Search ............... 714/752, 714/758, 746, 807, 808, 701, 718, 723, 719, 714/763; 711/114
See application file for complete search history.

(56) References Cited

U.S. PATENT DOCUMENTS

| 5,889,934 | A | | 3/1999 | Peterson |
| 6,098,190 | A | * | 8/2000 | Rust et al. ............... 714/763 |
| 6,553,511 | B1 | * | 4/2003 | DeKoning et al. ............. 714/6 |
| 6,584,544 | B1 | * | 6/2003 | Morley et al. ............. 711/114 |
| 2003/0204699 | A1 | * | 10/2003 | Talagala et al. ............. 711/202 |
| 2004/0153746 | A1 | * | 8/2004 | Talagala et al. ............... 714/8 |

OTHER PUBLICATIONS

EMC Corporation, Engineering White Paper, "EMC Double Checksum for Oracle," dated Nov. 1, 2001.

* cited by examiner

*Primary Examiner*—Phung My Chung
(74) *Attorney, Agent, or Firm*—Blakely, Sokoloff, Taylor & Zafman LLP (57) ABSTRACT

Error detection using data block mapping is provided. One method includes receiving a write request to write a user data block having a first block size, generating an error detection code for the user data block, appending the error detection code to the user data block to form an extended data block, and mapping the extended data block to a plurality of actual data blocks, each actual data block having a block size equal to the first block size.

30 Claims, 5 Drawing Sheets

ERROR DETECTION USING DATA BLOCK MAPPING

BACKGROUND OF THE INVENTION

A block addressable storage device is typically comprised of one or more disks, such as flexible disks, rigid disks, or optical discs, and stores data in addressable groups referred to as blocks. The number of bytes of data contained in a single block is called the block length or block size. While the block length can be any number of bytes, storage device manufacturers often preformat the storage devices into blocks with a block length of 512 bytes. Application programs that read and write data to the storage devices need assurance that data integrity is maintained as data is transferred between the storage device and application program.

Prior art storage devices include techniques for providing some assurances of data integrity. For instance, hard disk drive controllers often utilize an error correcting code (ECC) algorithm to detect and possibly correct hardware related failures within the hard drive. In addition to hardware errors, data integrity may be compromised by transport errors that occur during data transmission via Small Computer System Interface (SCSI) cables, storage adapter cards and storage device drivers. Failure to detect the transport errors or disk errors allows corrupt data to propagate. Undetected transport errors that occur within data are referred to as "silent data corruption." Silent data corruption occurs when the application program retrieves data from the storage system (i.e. a disk read request) that is stale, altered or lost without being detected or corrected. Stale data is data that was written at an earlier time and is incorrectly returned in place of the more recent (lost) data. Altered data is data that is present but corrupted or changed and no longer correctly represents the original data. Finally, lost data is data that is lost and no longer available. The presence of such errors is of substantial concern for critical applications where the impact of undetected errors can be catastrophic.

In view of the prevalence of silent data corruption, there is a need in the art to provide improved techniques to detect data corruption in storage systems. Moreover, there is a need for improved systems which can provide data corruption detection over a greater portion of the I/O path, instead of merely providing ECC protection within the hard disk drive alone.

BRIEF SUMMARY OF THE INVENTION

In accordance with embodiments of the present invention, a method for error detection using data block mapping is provided. The method comprises: receiving a write request to write a user data block having a first block size; generating an error detection code for the user data block; appending the error detection code to the user data block to form an extended data block; and mapping the extended data block to a plurality of actual data blocks, each actual data block having a block size equal to the first block size.

In accordance with further embodiments of the present invention, a computer system for error detection in storage data using data block mapping is provided. The computer system comprises: an application layer configured to generate write requests, each write request comprising a request to store a user data block having a first block size; an error correction code generation layer configured to receive the write requests from the application, said error correction code generation layer further configured to generate an error detection code for the user data block and append the error detection code to the user data block to form an extended data block; and a data mapping layer configured to map the extended data block to a plurality of actual data blocks, each actual data block having a block size equal to the first block size.

In accordance with further embodiments of the present invention, a computer-readable medium containing instructions for storing data using error detection codes is provided. The instructions cause operations to be performed comprising: receiving a write request to write a user data block having a first block size; generating an error detection code for the user data block; appending the error detection code to the user data block to form an extended data block; and mapping the extended data block to a plurality of actual data blocks, each actual data block having a block size equal to the first block size.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

In the following description, reference is made to the accompanying drawings which form a part thereof, and which illustrate several embodiments of the present invention. It is understood that other embodiments may be utilized and structural and operational changes may be made without departing from the scope of the present invention. The use of the same reference symbols in different drawings indicates similar or identical items.

DETAILED DESCRIPTION OF THE INVENTION

In the following description, reference is made to the accompanying drawings which illustrate several embodiments of the present invention. It is understood that other embodiments may be utilized and structural and operational changes may be made without departing from the scope of the present invention.

Some portions of the detailed description which follows are presented in terms of procedures, steps, logic blocks, processing, and other symbolic representations of operations on data bits that can be performed on computer memory. A procedure, computer executed step, logic block, process, etc., are here conceived to be a self-consistent sequence of steps or instructions leading to a desired result. The steps are those utilizing physical manipulations of physical quantities. These quantities can take the form of electrical or magnetic signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Checksumming has been used in network protocols, where each transmitted message is accompanied by a checksum code generated from the bits in the message. For instance, many checksum algorithms perform an exclusive-or (XOR) operation on the bits in the message to generate the checksum value. The receiving station then applies the same checksum, e.g. XOR to the message and checks to make sure that the accompanying numerical value is the same as the checksum code in the transmission. Similarly, the checksum can be used in the current implementation as an error-detection scheme to determine whether silent data corruption has occurred in retrieving the data from a storage device. Moreover, unlike network protocols, implementing checksums in a host system environment creates additional challenges since different requirements are demanded from the host system and the storage device than simply communicating between two devices. Design considerations include impact on system time, impact on system resources (i.e. CPU time, memory, disk capacity, etc.), and other functions to be performed by the host and storage device. Although checksums have been used within hard disk drives, existing checksum features within disk drives have limitations. For instance, checksums implemented within the storage device alone cannot detect silent data corruption which occurs between the storage device and the host applications.

Figure 1:
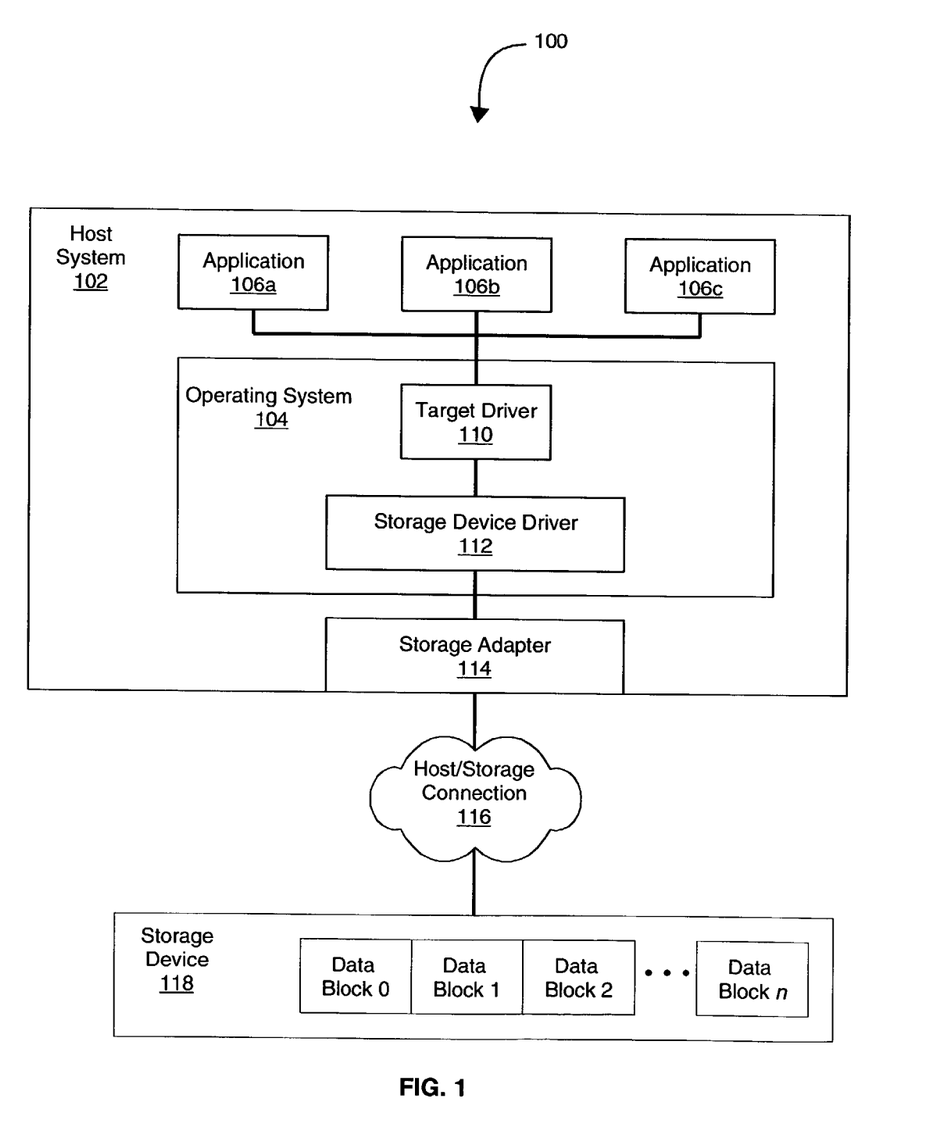
FIG. 1 shows a functional block diagram of a computing environment in accordance with embodiments of the present invention.

FIG. 1 illustrates a computing environment 100 in which embodiments of the present invention can be implemented. A host system 102 includes an operating system 104 and is capable of executing multiple application programs 106a–106c. The host system 102 may comprise any computational device known in the art including, for example, a server class machine, a mainframe, a desktop computer, a laptop computer, a hand held computer, or a telephony device. The operating system 104 may comprise any operating system known in the art capable of executing application programs and generating I/O requests. Although multiple applications can be executed on the host system 102, only three application programs 106a–106c are shown for illustration purposes. The applications 106a–106c can be any applications known in the art. The host system 102 can further include a target driver 110, a storage device driver 112, and a storage adapter card 114. The host system 102 is coupled to a storage device 118 via the host/storage connection 116. The host/storage connection 116 can be, for example, a local bus, a network connection, an interconnect fabric, or other communication channel. In some embodiments, a plurality of host systems 102 can be in communication with the storage device 118 via the host/storage connection 116, or a plurality of storage devices 118 can be in communication with one or more host systems 102.

In FIG. 1, the storage device 118 is formatted into a plurality of n data blocks, data block 0, data block 1, data block 2, through data block n. The number of blocks in the storage device 118 can vary and may exceed several million or more. The storage device 118 may comprise any storage device known in the art, such as a single hard disk drive, a Direct Access Storage Device (DASD), a Just a Bunch of Disks (JBOD) array, a Redundant Array of Independent Disks (RAID), a tape library, an optical library, and so on. Manufacturers of the storage device 118 often preformat the storage device 118 into blocks of block length 512 bytes. However, it may be possible for the storage device 118 to be formatted into blocks of any size.

The application programs 106a–106c can generate Input/Output (I/O) requests to the storage device 118, where the data files used by the application programs 106a–106c can be stored and recalled. In certain implementations, to coordinate the I/O process, I/O requests are transferred from the application programs 106a–106c to a target driver 110 for communicating with the storage device driver 112. If an I/O request is for the storage device 118, the target driver 110 determines which blocks within the storage device 118 should be accessed to read/write the data used by the applications 106a–106c.

The target driver 110 can communicate with the storage device 118 through the storage device driver 112 and the storage adapter 114 in any of a number of ways known to those of ordinary skill in the art. For example, the target driver 110 can generate generic device commands in response to I/O requests from the applications 106a–106c. The generic device commands are converted to device specific commands by the storage device driver 112. The storage adapter 114 transmits these device specific commands over the host/storage connection 116 to the storage device 118. The storage adapter 114 can be, for example, a host bus adapter card coupled to the local bus on the host system 102. The target driver 110 and the storage device driver 112 may be implemented as software programs that execute within the host system 102 or their code may be implemented in a hardware device, such as integrated circuit logic.

Figure 2:
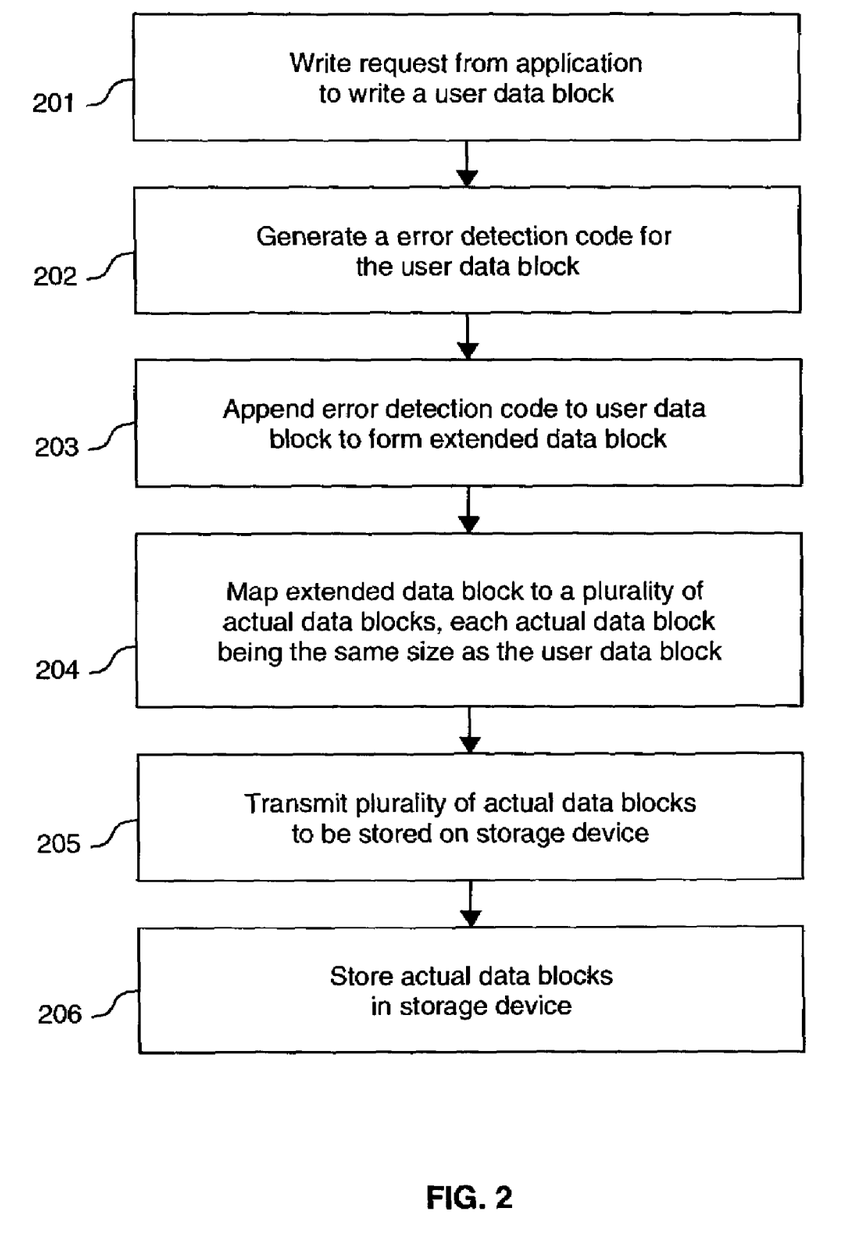
FIG. 2 shows a flowchart of a method for error detection using data block mapping in accordance with embodiments of the present invention.

FIG. 2 illustrates a method for error detection using data block mapping in accordance with embodiments of the present invention. In step 201, the application 106a generates a write request to write a data block on the storage device 118. Although the method shown in FIG. 2 discusses the processing of a single data block, it is understood that the write request from the application 106a may include a request to write a plurality of data blocks on the storage device 118. The method can be applied to the processing of any number of data blocks. As used herein, the term "user data block" is meant to refer to the data blocks requested by the applications 106a–106c. The size of each user data block can vary, but in some embodiments, each user data block is 512 bytes because the applications 106a–106c are designed to operate with storage devices having the standard 512-byte formatting.

Figure 3:
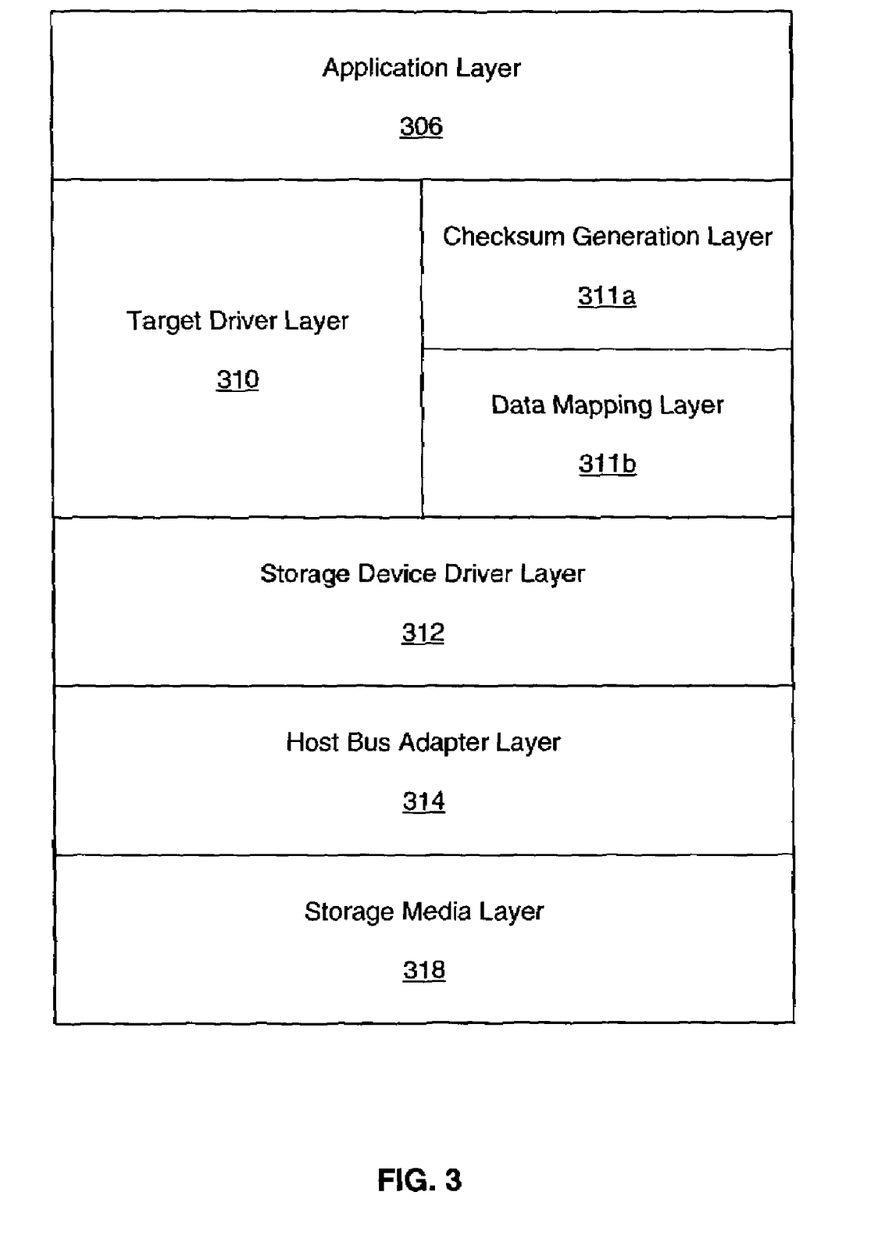
FIG. 3 is a layered view of a computing environment in accordance with embodiments of the present invention.

The method shown in FIG. 2 may be better understood with reference to the layered view of computing environment 100 shown in FIG. 3 in accordance with various embodiments of the present invention. The write request in step 201 described above may be generated by an application layer 306. As is common for most applications 106a–106c, the write request is presented to the target driver layer 310 in data blocks of 512 bytes. This write request is then received by a target driver layer 310, which includes a checksum generation layer 311a and a data mapping layer 311b.

In step 202, an error detection code for the user data block is generated. The error detection code can be any code which can be used to detect and/or correct errors contained in the data block and can vary in size, depending on the coding algorithm and the level of data protection and correction desired. The error detection code can be generated, for example, by checksum generation layer 311a in FIG. 3. In one embodiment, the user data block is a 512 byte block, and the error detection code is a checksum generated using a 32-bit XOR algorithm. It may be desirable to reserve additional bytes of space within the portion allocated for the error detection code in order to accommodate different types of checksum algorithms which may be used in the future. For example, the checksum block may comprise eight bytes, where the first four bytes are generated using the 32-bit XOR algorithm, an additional byte is used to store an error detection code version number, and three bytes are reserved for future error detection and/or correction codes. The error detection code version number provided in the checksum block can facilitate rapid switching from one error detection code algorithm to another. The checksum may also be seeded with the logical disk block number of the targeted disk block and the world wide name of the disk. In other embodiments, the error detection code can be a cyclic redundancy check (CRC), or an error correction code (ECC) generated using, for example, a Reed-Solomon code or a modified Hamming code. Numerous variations in the size and algorithm used to generate the error detection code are possible and contemplated.

In step 203, this error detection code is appended to the user data block to form an extended data block. The extended data block is passed to the data mapping layer 311b. In step 204, the data mapping layer 311b maps the extended data block to a plurality of actual data blocks. These "actual data blocks" are the data blocks 0–n on the storage device 118 in FIG. 1.

Many existing application programs 106a–106c are configured to operate on data in blocks of 512 bytes. Similarly, many existing storage devices 118 are configured and initialized to store 512-byte data blocks. However, by adding the 16 bytes of error detection code, the standard 512-byte user data block transmitted by the application 106a now consumes 528 bytes of storage capacity. While it may be possible to reformat the storage device 118 to accommodate 528-byte blocks, many storage devices currently on the market do not provide this capability. In accordance with embodiments of the present invention, these 528-byte extended data blocks are mapped to 512-byte actual data blocks as described in further detail below.

Figure 4:
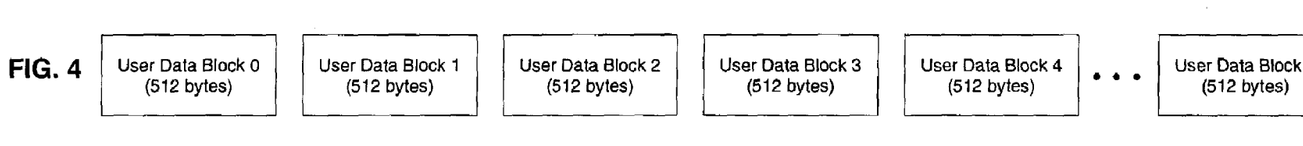
FIGS. 4–7 are block diagrams showing data block mapping in accordance with embodiments of the present invention.
Figure 5:
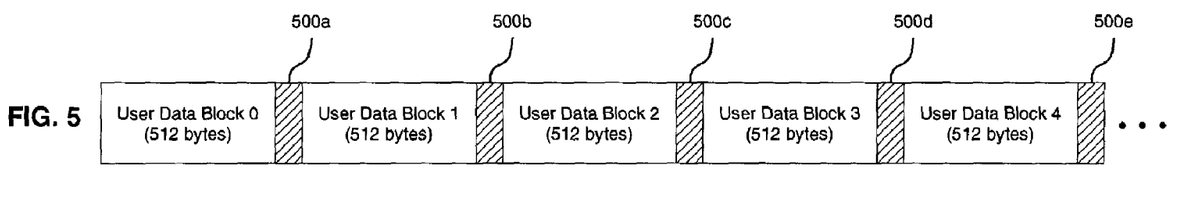

FIGS. 4–7 are block diagrams which provide an illustration of steps 201–204 in accordance with one embodiment of the present invention. FIG. 4 shows a plurality of user data blocks 0–n, each user data block being 512 bytes in size. As described above, user data blocks 0–n are received from the application layer 306 to be stored on the storage device 118. FIG. 5 shows user data blocks 0–4 having checksums 500a–500e appended thereto. Each checksum 500 comprises 16 bytes and can be generated using any of the algorithms described above. In other embodiments, the checksum can be any size, such as 8 bytes, 32 bytes, etc.

Figure 6:
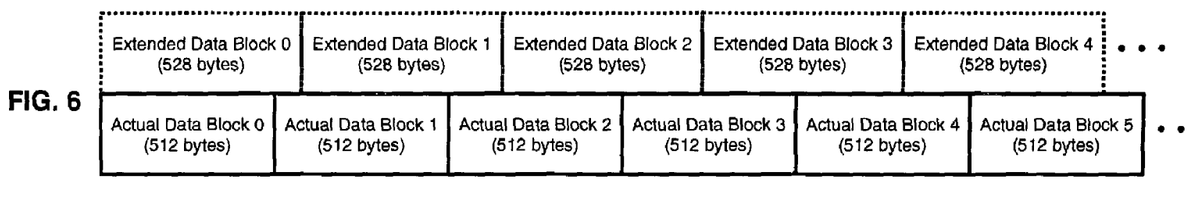

FIG. 6 shows extended data blocks 0–4, which are produced by appending each 16-byte checksum 500 to corresponding user data blocks 0–4. Accordingly, each extended data block 0–4 comprises 528 bytes. FIG. 6 further shows how extended data blocks 0–4 can be mapped to actual data blocks 0–5. Here, each actual data block 0–5 comprises 512 bytes, which is the same size as the user data blocks 0–n received from the application layer 306. Actual data blocks 0–5 correspond with disk data blocks 0–n shown in FIG. 1. Because extended data block 0 includes the original 512 bytes from user data block 0 as well as an additional 16 bytes from the corresponding checksum 500a, extended data block 0 is larger than actual data block 0 and is therefore mapped to more than one actual data block. However, the mapping of extended data block 0 only consumes the first 16 bytes of actual data block 1, leaving 496 bytes remaining in actual data block 1. If the next user data block received from the application layer 306 (user data block 1) is mapped to actual data blocks 2–3, then the remaining 496 bytes of actual data block 1 are left unused, resulting in wasted storage space in the storage device 118.

In accordance with embodiments of the present invention, extended data block 1 is mapped to actual data blocks 1–2, starting at a point in actual data block 1 after the data from extended data block 0 ends (e.g., the last 496 bytes of actual data block 1). Because only the first 496 bytes of extended data block 1 can be stored in actual data block 1, the remaining 32 bytes of extended data block 1 are stored in the first 32 bytes of actual data block 2. The remaining 480 bytes of actual data block 2 can then be used to store the first 480 bytes of extended data block 2.

In one embodiment, the data mapping layer 311b can determine the proper mapping for any extended data block using the following simple formula:

$$Trunc\left(\frac{(UserDataBlock\#) \times (ExtendedDataBlockSize)}{ActualDataBlockSize}\right)$$

This formula generates the block number for the actual data block where any extended data block begins. Because in this embodiment each extended data block size is larger than the size of a single actual data block and smaller than the size of two actual data blocks, it is known that any extended data block will span exactly two actual data blocks. Accordingly, the extended data block will be mapped to the actual data block number generated by the formula above, plus the subsequent actual data block.

For example, to map extended data block 2 (which corresponds to user data block 2 plus its corresponding checksum), the formula is calculated as follows:

$$Trunc\left(\frac{2 \times 528}{512}\right) = Trunc(2.0625) = 2$$

Accordingly, extended data block 2 is mapped to actual data blocks 2–3.

Figure 7:
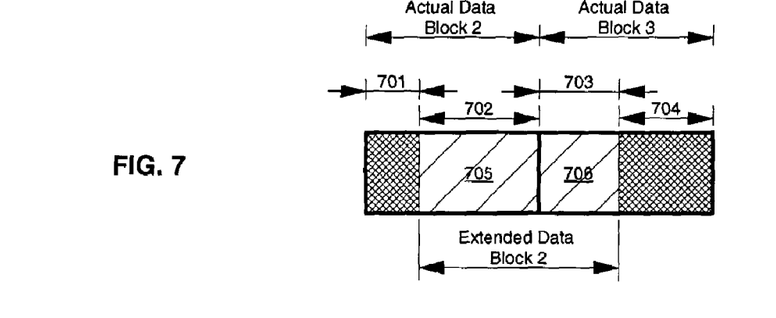

FIG. 7 shows a more detailed block diagram of the mapping of extended data block 2 to actual data blocks 2–3. Actual data block 2 is divided into a first portion 701 and a second portion 702, and actual data block 3 is divided into a first portion 703 and a second portion 704. In the mapping process, extended data block 2 is separated into a first segment 705 and a second segment 706, which are split between actual data blocks 2–3. The first portion 701 of actual data block 2 contains the last 32 bytes of extended data block 1, while the second portion 702 of actual data block 2 contains the first 480 bytes of extended data block 2 (i.e., the first segment 705 of extended data block 2). The first portion 703 of actual data block 3 contains the last 48 bytes of extended data block 2 (i.e., the second segment 706 of extended data block 2). Finally, the second portion 704 of actual data block 3 contains 464 bytes which can be used to store the first 464 bytes of extended data block 3.

The precise location within actual data block 2 where first portion 701 begins can be determined a variety of ways. In one embodiment, a multiplier value calculated as:

$$MultiplierValue = \frac{ExtendedDataBlockSize}{ChecksumSize}$$

can be stored when the system is first configured to implement the invention. In the example given above, the multiplier value is 528/16=33. Then, when a data block is requested, a modulus is performed on the requested data block and the multiplier value. For the present example, this is calculated as follows:

StartingByte=((UserDataBlock#)%(Location Value))× (ChecksumSize)

StartingByte=(2%33)×(16)=(2)×(16)=32

Therefore, user data block 2 begins at the 32 byte in actual data block 2.

In another example, the above-described techniques can be used to determine the location of a requested user data block #324708 as follows:

$$ActualDataBlock\# = Trunc\left(\frac{324708 \times 528}{512}\right)$$
$$= Trunc(334855.13)$$
$$= 334855$$

StartingByte=(324708%33)×(16)=(21)×(16)=336

Therefore, user data block 324708 is stored starting at the 336 byte of actual data block 334855.

In other embodiments, the mapping of extended data blocks to actual data blocks can be performed in various ways. For example, the data mapping layer 311b can generate a table in which the mappings for each extended data block are stored.

Once the mapping for the extended data block is completed, the method of FIG. 2 proceeds to step 205 in which the plurality of actual data blocks are transmitted to be stored on the storage device 118. In the example above, extended data block 0 (which corresponds to user data block 0 and checksum 500a) has been mapped to actual data blocks 0–1. The target driver layer 310 then generates generic device commands containing the write instructions with the block numbers for the targeted actual data blocks 0–1 and the data for extended data block 0 split between actual data blocks 0–1. These generic device commands are transmitted to the storage device driver layer 312, which then converts the generic device commands to device specific commands and transmits the write instructions to the host bus adapter layer 314.

Next, the host bus adapter layer 314 transmits the write instructions to the storage media layer 318 using any of a number of methods well known to those of ordinary skill in the art. At the storage media layer 318, the actual data blocks can be stored in non-volatile memory, such as on sectors of a hard disk drive. In some embodiments, the actual data blocks having sequential block numbers are stored in adjacent physical locations on the storage media. Therefore, when writing data to actual data blocks 0–1, the data can be written in a continuous series of sectors, thereby reducing the delays resulting from excessive movement of the read/write head of the disk drive.

Many existing storage device drivers manipulate data in 512 byte sized blocks. In the embodiment described above, the checksumming and data mapping are performed by the target driver layer 310. Therefore, the storage device driver is provided data in 512 byte size blocks (instead of the 528 byte sized extended data blocks) and need not be modified in order to handle the data and the corresponding checksum. The use of unmodified drivers can result in cost savings for the development of storage systems and may reduce errors and conflicts. In addition, implementing the error detection code generation and data block mapping at the target driver level may be advantageous because the error detection code can cover more of the I/O path (i.e., be more "end-to-end"), can interact with all types of adaptor drivers, can operate without any hardware support, and can operate directly on the user data sent from the application programs 106a–106c.

In the described embodiment, the checksum is stored together with the data rather than keeping the checksum information separate. This can eliminate the need for providing a dedicated portion of the storage device for the checksum data. By storing the data from a single user data block in a plurality of actual data blocks on the storage device 118, an undesirable performance degradation may result when later retrieving this data. However, because data is usually requested from storage devices in groups of several adjacent blocks, many existing storage devices 118 when requested to retrieve a single data block are configured to automatically retrieve multiple data blocks in anticipation of receiving requests for subsequent data blocks. Therefore, the delay introduced by retrieving multiple data blocks can be minimized or reduced in such systems.

Other layers exist in the I/O subsystem in FIG. 3, but are not shown to improve clarity. In other embodiments of the invention, the generation of the error detection code and the mapping of the extended data blocks to actual data blocks can be performed by any layer, and need not be limited to the target driver layer 310. In various embodiments, different architectures may be used.

In some embodiments, it may be desirable to retrieve the existing contents of the targeted actual data blocks before writing new data. For example, referring back to FIG. 7, the target driver layer 310 may first retrieve the existing contents of actual data blocks 2–3 before writing the data from extended data block 2. The existing data in the first portion 701 of actual data block 2 can be combined with the first segment 705 of extended data block 2 to form a complete data block which can then be transmitted to the storage device 118 to be stored in actual data block 2. Next, the second segment 706 of extended data block 2 can be combined with the existing data in the second portion 704 of actual data block 3 to form a complete data block to be transmitted to the storage device 118 to be stored in actual data block 3. This process of fetching the existing data before rewriting the new data can help to ensure the existing data is not lost during the writing process. It may not be necessary, however, to fetch the existing data if a series of data blocks are to be written. For example, if a series of user data blocks 0–4 are to be sequentially written to the storage device 118, only the first and last data block in the series may overlap with existing data. Accordingly, the set of extended data blocks 0–3 may be transmitted together without prefetching the existing data in the targeted actual data blocks.

Figure 8:
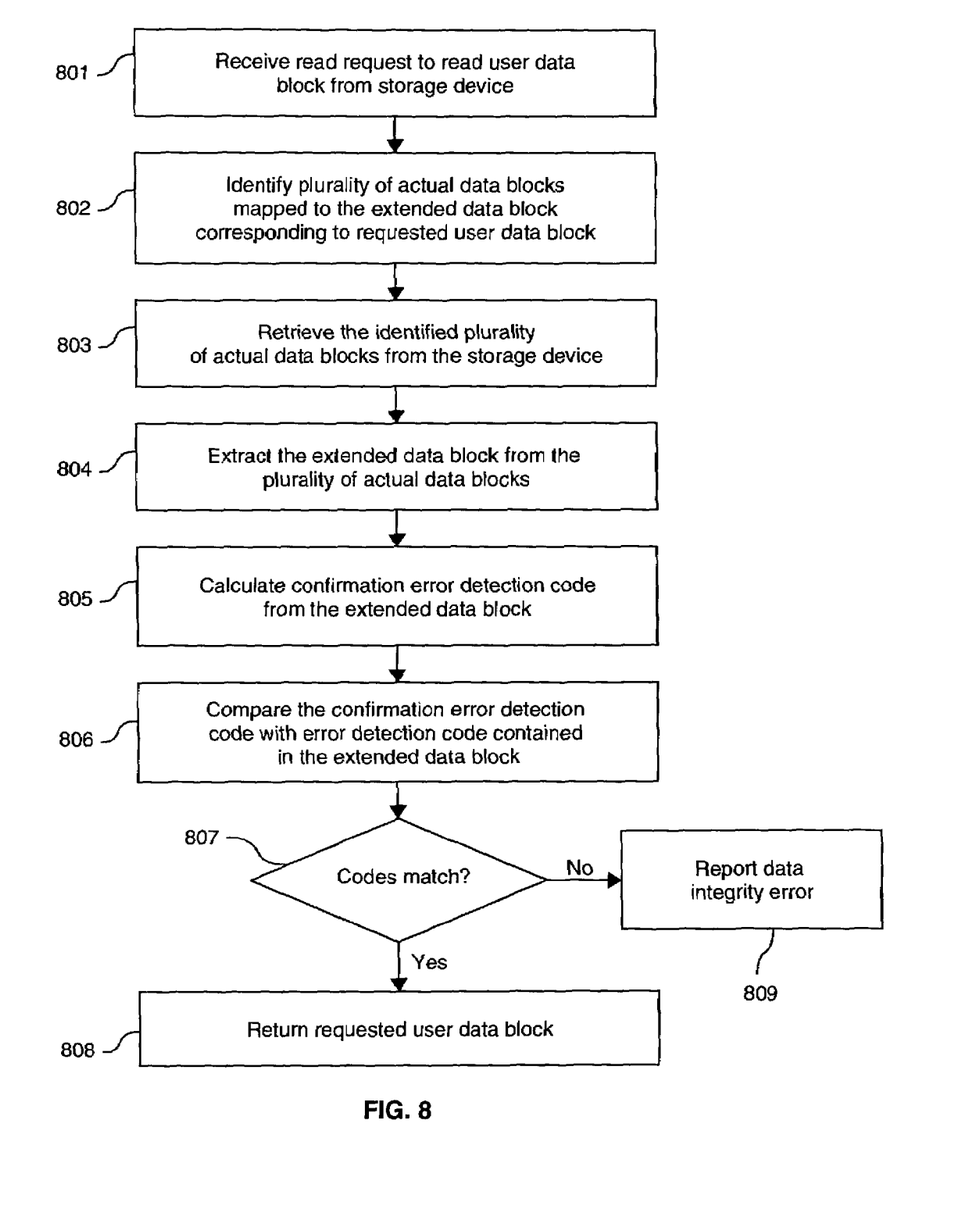
FIG. 8 shows a flowchart of a method for error detection using data block mapping in accordance with embodiments of the present invention.

FIG. 8 illustrates a method of retrieving data from the storage device 118 in accordance with embodiments of the present invention. In step 801, a read request is received. This read request may be generated in the application layer 306 and received by the target driver layer 310. The read request will typically specify one or more user data blocks to be retrieved from the storage device 118. As described above, when the user data block is first written to the storage device 118, an error detection code is appended to the user data block to form an extended data block. This extended data block is then mapped to a plurality of actual data blocks. In step 802, the data mapping layer 311b will identify the plurality of actual data blocks mapped to the requested user data block(s).

The identification of the actual data blocks mapped to the requested user data blocks can be performed in various ways, depending on the way in which the user data blocks were initially mapped to the actual data blocks. This identification can be performed, for example, through the use of a mathematical formula, such as the one given above, or can be performed by looking up the requested user data blocks in a table.

In step 803, the identified plurality of actual data blocks mapped to the requested user data block(s) are retrieved. This retrieval can be performed in various ways. In some embodiments, the target driver layer 310 will transmit a read request to the storage device driver layer 312, requesting the identified actual data blocks. The storage device driver layer 312 then locates where in the storage device 118 the identified actual data blocks are stored and sends the locations of the identified actual data blocks to the host bus adapter layer 314. The host bus adapter layer 314 then requests the data blocks from the storage media layer 318, which returns the requested data. The requested actual data blocks are then passed up to the target driver layer 310. In some systems, the identified actual data blocks may have been stored in a cache memory either within the storage device 118 or the host system 102. In this case, the identified actual data blocks may be retrieved directly from cache memory instead of being read from the disks in the storage device 118.

In step 804, an extended data block is extracted from the plurality of actual data blocks identified in step 802 and retrieved in step 803. With reference to the embodiment shown in FIG. 7, extended data block 2 is stored in actual data blocks 2–3. First portion 701 of actual data block 2 and second portion 704 of actual data block 3 contain data not requested by the application layer 306, so to extract extended data block 2 from actual data blocks 2–3, these portions 701, 704 can be disregarded. Second portion 702 of actual data block 2 and first portion 703 of actual data block 3 are then combined to form extended data block 2.

In step 805, a confirmation error detection code is calculated from the data contained in the retrieved extended data block. As described above, each extended data block contains a user data block and a corresponding error detection code. In step 805, a new error detection code (i.e., the confirmation error detection code) is generated based on the data from the user data block contained in the retrieved extended data block. This confirmation error detection code is generated using the same technique used to generate the error detection code when the user data block was first written to the storage device 118. In the example described above with respect to FIGS. 4–7, the error detection code is generated using an XOR checksum calculation.

In step 806, the confirmation error detection code generated in step 805 is compared with the error detection code contained in the extended data block retrieved in step 803. If the two error detection codes match in step 807, then it is presumed that the data contained in the extended data block has not experienced any data corruption. Accordingly, in step 808, the user data block contained in the retrieved extended data block is returned to the requesting application 106. If the two error detection codes do not match, then it can be assumed that the data from the original user data block has been corrupted somewhere between the time when the original error detection code was generated and the time when the confirmation error detection code is generated. Accordingly, in step 809, a data integrity error is reported.

The host system 102 may respond to this data integrity error in various ways. In some embodiments, the target driver layer 310 merely reports the existence of the error to the application layer 306 and leaves it to the application layer 306 to manage the error. In other embodiments, the error detection code may also provide error correction capability, such as, for example, when the error detection code is a modified Hamming code ECC. When using such an error correction code, if the confirmation error detection/correction code does not match with the original error detection/correction code, the original error detection/correction code can then be used to restore the corrupted bits in the user data block before returning the requested user data block to the application layer 306.

Generating and checking the error detection code at the host or driver level, versus within the disk drive or storage device enclosure, may enable detection of silent data corruption that occurs between the disk drive and the host. As stated above, silent data corruption may result from transport errors occurring in the SCSI cables, storage driver adapters, storage device drivers, etc. By placing the error detection routine at the host or driver level, silent data corruption occurring upstream from the disk drive is detected. In addition, locating the error detection routine at the host or driver level implements the error detection independent of the hardware. No additional hardware is required to perform the error detection function. Instead, a software update can be performed to an existing host system 102 to install an updated target driver containing the error detection program. Furthermore, keeping the error detection function at the host or driver level allows the error detection to remain functionally transparent to users, operating without affecting existing applications 106a–106c on the host system 102 or requiring updates or modifications to the host system applications 106a–106c. Moreover, there is no need to modify the storage device driver 112, which is typically supplied by the manufacturers of the corresponding storage device 118, in order to accommodate the error detection process.

While the invention has been described in terms of particular embodiments and illustrative figures, those of ordinary skill in the art will recognize that the invention is not limited to the embodiments or figures described. For example, in the embodiment described above, since the checksum is both generated and checked by the checksum generation layer 311a, neither the original error detection code nor the confirmation error code need be returned to the requesting application 106a–106c. However, in other embodiments, the present invention may be implemented in other ways. For example, the error detection code generation and checking may be performed as part of application layer 306, the storage device driver layer 312, or the host bus adapter layer 314. Numerous variations are possible and contemplated.

In the embodiment shown in FIG. 2, the host system 102 and the storage device 118 are shown as separate blocks connected by a host/storage connection 116. It is understood that the host system 102 and the storage device 118 may in some embodiments be physically contained within the same enclosure. In other embodiments, one or more storage devices may be part of a storage area network geographically distant from the location of one or more host systems.

The described implementations show the host system 102 reading and writing to the storage device 118. In one example, a 32-bit XOR algorithm was used for checksumming. Alternatively, other algorithms can be used for generating a suitable error detection code which can be used to compare the original error detection code to the confirmation error detection code generated based on the retrieved data. In addition, the checksum was described with a certain number of bytes of information. Alternatively, the storage device 118 can be reformatted to any other disk block length to increase or decrease the disk block length to accommodate different checksum sizes and data blocks.

The program logic described indicates certain events occurring in a certain order. Those of ordinary skill in the art will recognize that the ordering of certain programming steps or program flow may be modified without affecting the overall operation performed by the preferred embodiment logic, and such modifications are in accordance with the various embodiments of the invention. Additionally, certain of the steps may be performed concurrently in a parallel process when possible, as well as performed sequentially as described above.

The described error detection techniques may be implemented as a method, apparatus or article of manufacture using standard programming and/or engineering techniques to produce software, firmware, hardware, or any combination thereof. The term "article of manufacture" as used herein refers to code or logic implemented in hardware logic (e.g., an integrated circuit chip, Programmable Gate Array (PGA), Application Specific Integrated Circuit (ASIC), etc.) or a computer readable medium such as, for example, magnetic storage medium (e.g. hard disk drives, floppy disks, tape), optical storage (e.g., CD-ROMs, optical disks, etc.), volatile and non-volatile memory devices (e.g., EEPROMs, ROMs, PROMs, RAMs, DRAMs, SRAMs, firmware, programmable logic, etc.). Code in the computer readable medium is accessed and executed by a processor.

The code in which implementations are made may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Of course, those skilled in the art will recognize that many modifications may be made to this configuration without departing from the scope of the implementations, and that the article of manufacture may comprise any information bearing medium known in the art.

The foregoing description of the preferred embodiments of the invention has been presented for the purposes of illustration and description. It is not intended to be exhaustive or to limit the invention to the precise form disclosed. Therefore, it should be understood that the invention can be practiced with modification and alteration within the spirit and scope of the appended claims.

What is claimed is:

1. A method for error detection using data block mapping performed by a host storage system, the method, comprising:
    receiving a write request to write a user data block having a first block size;
    generating an error detection code for the user data block;
    appending the error detection code to the user data block to form an extended data block;
    mapping a first segment of the extended data block to a first actual data block having a block size equal to the first block size, wherein the first actual data block comprises a first portion and a second portion such that said first segment of the extended data block is mapped to the second portion of the first actual data block; and
    mapping a second segment of the extended data block to a second actual data block having a block size equal to the first block size, wherein the second actual data block comprises a first portion and a second portion such that said second segment of the extended data block is mapped to the first portion of the second actual data block;
    transmitting the first actual data block and the second actual data block to a storage device; and
    storing the first actual data block and the second actual data block on the storage device.

2. The method of claim 1, wherein:
    said storing the first actual data block and the second actual data block on the storage device comprises storing the first actual data block and the second actual data block in adjacent physical locations on the storage device.

3. The method of claim 1, wherein:
    said generating the error detection code for the user data block comprises one of the following:
        generating an XOR checksum of the user data block; or
        generating a CRC checksum of the user data block.

4. The method of claim 1, further comprising:
    retrieving existing data from the first and second actual data blocks on a storage device; and
    transmitting the first and second actual data blocks to the storage device to be stored, wherein:
        the first portion of the first actual data block includes the existing data retrieved from the first actual data block and the second portion of the first actual data block includes the first segment of the extended data block; and
        the first portion of the second actual data block includes the existing data retrieved from the second actual data block and the second portion of the second actual data block includes the second segment of the extended data block.

5. The method of claim 1, further comprising:
    receiving a read request to read the user data block from the storage device;
    identifying a plurality of a actual data blocks mapped to the extended data block corresponding to the requested user data block;
    retrieving the identified plurality of actual data blocks from the storage device; and
    extracting the extended data block from the identified plurality of actual data blocks retrieved from the storage device.

6. The method of claim 5, further comprising:
    verifying that the extracted data block extracted from the plurality of actual data blocks is free from data integrity errors.

7. The method of claim 6, wherein:
    said verifying that the extracted data block extracted from the plurality of actual data blocks does not contain a data integrity error comprises:
        calculating a confirmation error detection code from the extended data block extracted from the plurality of actual data blocks retrieved from the storage device; and comparing the confirmation error detection code with the error detection code contained in the extended data block.

8. The method of claim 7, further comprising:
reporting a data integrity error if the confirmation error detection code does not correspond with the error detection code contained in the extended data block.

9. A computer system for error detection in storage data using data block mapping, comprising:
an application layer configured to generate write requests, each write request comprising a request to store a user data block having a first block size;
an error correction code generation layer configured to receive the write requests from the application, said error correction code generation layer further configured to generate an error detection code for the user data block and append the error detection code to the user data block to form an extended data block; and
a data mapping layer configured to map a first segment of the extended data block to a first actual data block having a block size equal to the first block size, wherein the first actual data block comprises a first portion and a second portion such that said first segment of the extended data block is mapped to the second portion of the first actual data block, and to map a second segment of the extended data block to a second actual data block having a block size equal to the first block size, wherein the second actual data block comprises a first portion and a second portion such that said second segment of the extended data block is mapped to the first portion of the second actual data block;
a storage device driver layer configured to transmit the first actual data block and the second actual data block to a storage device; and
a storage device configured to store the first actual data block and the second actual data block on the storage device.

10. The system of claim 9, wherein:
said storage device is further configured to store the first actual data block and the second actual data block in adjacent physical locations on the storage device.

11. The system of claim 9, wherein:
said error correction code generation layer is further configured to generate the error detection code using one of the following techniques:
an XOR checksum of the user data block; or a CRC checksum of the user data block.

12. The system of claim 9, wherein:
said data mapping layer is further configured to retrieve existing data from the first and second actual data blocks on a storage device and transmit the first and second actual data blocks to the storage device driver layer, wherein:
the first portion of the first actual data block includes the existing data retrieved from the first actual data block and the second portion of the first actual data block includes the first segment of the extended data block; and
the first portion of the second actual data block includes the existing data retrieved from the second actual data block and the second portion of the second actual data block includes the second segment of the extended data block.

13. The system of claim 12, wherein:
said application layer is further configured to generate read requests, each read request comprising a request to retrieve the user data block having the first block size;
said data mapping layer is further configured to identify a plurality of actual data blocks mapped to the extended data block corresponding to the requested user data block;
said storage device driver layer is further configured to retrieve the identified plurality of actual data blocks from the storage device; and
said data mapping layer is further configured to extract the extended data block from the plurality of actual data blocks retrieved from the storage device.

14. The system of claim 13, wherein:
said error detection code generation layer is further configured to verify that the extracted data block extracted from the plurality of actual data blocks is free from data integrity errors.

15. The system of claim 14, wherein:
said error detection code generation layer is further configured to verify that the extracted data block extracted from the plurality of actual data blocks does not contain a data integrity error by calculating a confirmation error detection code from the extended data block extracted from the plurality of actual data blocks retrieved from the storage device and comparing the confirmation error detection code with the error detection code contained in the extended data block.

16. The system of claim 15, wherein:
said error detection code generation layer is further configured to report a data integrity error if the confirmation error detection code does not correspond with the error detection code contained in the extended data block.

17. A computer-readable medium having stored thereon data representing instructions that, when executed by a processor, cause the processor to perform operations comprising:
receiving a write request to write a user data block having a first block size; generating an error detection code for the user data block;
appending the error detection code to the user data block to form an extended data block;
mapping a first segment of the extended data block to a first actual data block having a block size equal to the first block size, wherein the first actual data block comprises a first portion and a second portion such that said first segment of the extended data block is mapped to the second portion of the first actual data block; and
mapping a second segment of the extended data block to a second actual data block having a block size equal to the first block size, wherein the second actual data block comprises a first portion and a second portion such that said second segment of the extended data block is mapped to the first portion of the second actual data block;
transmitting the first actual data block and the second actual data block to a storage device; and
storing the first actual data block and the second actual data block on the storage device.

18. The computer-readable medium of claim 17, wherein:
said storing the first actual data block and the second actual data block on the storage device comprises storing the first actual data block and the second actual data block in ajacent physical locations on the storage device.

19. The computer-readable medium of claim 17, wherein:
said generating the error detection code for the user data block comprises one of the following:
generating an XOR checksum of the user data block; or
generating a CRC checksum of the user data block.

20. The computer-readable medium of claim 17, wherein said instructions cause the further operation to be performed:
retrieving existing data from the first and second actual data blocks on a storage device; and
transmitting the first and second actual data blocks to the storage device to be stored, wherein:
the first portion of the first actual data block includes the existing data retrieved from the first actual data block and the second portion of the first actual data block includes the first segment of the extended data block; and
the first portion of the second actual data block includes the existing data retrieved from the second actual data block and the second portion of the second actual data block includes the second segment of the extended data block.

21. The computer-readable medium of claim 17, wherein said instructions cause the further operation to be performed:
receiving a read request to read the user data block from the storage device;
identifying the plurality of actual data blocks mapped to the extended data block corresponding to the requested user data block;
retrieving the identified plurality of actual data blocks from the storage device; and extracting the extended data block from the identified plurality of actual data blocks retrieved from the storage device.

22. The computer-readable medium of claim 21, wherein said instructions cause the further operation to be performed:
verifying that the extracted data block extracted from the plurality of actual data blocks is free from data integrity errors.

23. The computer-readable medium of claim 22, wherein:
said verifying that the extracted data block extracted from the plurality of actual data blocks does not contain a data integrity error comprises:
calculating a confirmation error detection code from the extended data block extracted from the plurality of actual data blocks retrieved from the storage device; and
comparing the confirmation error detection code with the error detection code contained in the extended data block.

24. The computer-readable medium of claim 23, wherein said instructions cause the further operation to be performed:
reporting a data integrity error if the confirmation error detection code does not correspond with the error detection code contained in the extended data block.

25. A method for error detection using data block mapping performed by a host storage system, the method, comprising:
receiving a write request to write a user data block having a first block size;
generating an error detection code for the user data block;
appending the error detection code to the user data block to form an extended data block;
mapping the extended data block to a plurality of actual data blocks, each actual data block having a block size equal to the first block size;
receiving a read request to read the user data block from a storage device;
identifying the plurality of actual data blocks mapped to the extended data block corresponding to the requested user data block;
retrieving the identified plurality of actual data blocks from the storage device; and
extracting the extended data block from the identified plurality of actual data blocks retrieved from the storage device;
transmitting the plurality of actual data blocks to a storage device; and
storing the plurality of actual data blocks on the storage device.

26. The method of claim 25, wherein:
said storing the plurality of actual data blocks on the storage device comprises storing the plurality of actual data blocks in adjacent physical locations on the storage device.

27. The method of claim 25, wherein:
said generating the error detection code for the user data block comprises one of the following:
generating an XOR checksum of the user data block; or
generating a CRC checksum of the user data block.

28. A computer-readable medium having stored thereon data representing instructions that, when executed by a processor, cause the processor to perform operations comprising:
receiving a write request to write a user data block having a first block size;
generating an error detection code for the user data block;
appending the error detection code to the user data block to form an extended data block;
mapping the extended data block to a plurality of actual data blocks, each actual data block having a block size equal to the first block size;
receiving a read request to read the user data block from a storage device;
identifying the plurality of actual data blocks mapped to the extended data block corresponding to the requested user data block;
retrieving the identified plurality of actual data blocks from the storage device; and
extracting the extended data block from the identified plurality of actual data blocks retrieved from the storage device;
transmitting the plurality of actual data blocks to a storage device; and
storing the plurality of actual data blocks on the storage device.

29. The computer-readable medium of claim 28, wherein:
said storing the plurality of actual data blocks on the storage device comprises storing the plurality of actual data blocks in adjacent physical locations on the storage device.

30. The computer-readable medium of claim 28, wherein:
said generating the error detection code for the user data block comprises one of the following:
generating an XOR checksum of the user data block; or
generating a CRC checksum of the user data block.

* * * * *